United States Patent [19]
Seaford et al.

[11] Patent Number: 6,117,697
[45] Date of Patent: Sep. 12, 2000

[54] SOLID STATE MAGNETIC FIELD SENSOR METHOD

[75] Inventors: Matthew L. Seaford; Kurt G. Eyink, both of Beavercreek; David H. Tomich, Dayton; William V. Lampert, Tipp City, all of Ohio

[73] Assignee: The United States of America as represented by the Secretary of the Air Force, Washington, D.C.

[21] Appl. No.: 09/122,611

[22] Filed: Jul. 27, 1998

[51] Int. Cl.[7] .................................................. H01L 21/00
[52] U.S. Cl. ............................................ 438/19; 438/604
[58] Field of Search ................... 438/604, 19; 338/32 R; 357/27

[56] References Cited

U.S. PATENT DOCUMENTS

| | | |
|---|---|---|
| 4,926,154 | 5/1990 | Heremans et al. . |
| 4,958,203 | 9/1990 | Takikawa . |
| 5,117,543 | 6/1992 | Heremans et al. . |
| 5,153,557 | 10/1992 | Partin et al. . |
| 5,184,106 | 2/1993 | Partin et al. ........................... 338/32 R |
| 5,196,821 | 3/1993 | Partin et al. . |
| 5,491,461 | 2/1996 | Partin et al. ........................... 338/32 R |
| 5,508,611 | 4/1996 | Schroeder et al. . |

OTHER PUBLICATIONS

Molecular Beam Epitaxy, M.A. Herman and H. Sitter, copyright 1989, pp 219–225.

*Primary Examiner*—Richard Elms
*Assistant Examiner*—Bradley K. Smith
*Attorney, Agent, or Firm*—Gina S. Tollefson; Gerald B. Hollins; Thomas L. Kundert

[57] ABSTRACT

A method for making a magnetoresistive sensing device including depositing an ultrathin active film responsive to changes in magnetic field energy onto a compliant layer of periodic table group III–V semiconductor material on a semiconductor substrate wafer, the compliant layer being capable of retaining strain energy resulting from the layering semiconductor materials with different lattice constants. This method produces a battery operable ultrathin device highly sensitive to changes in magnetic field flux.

17 Claims, 4 Drawing Sheets

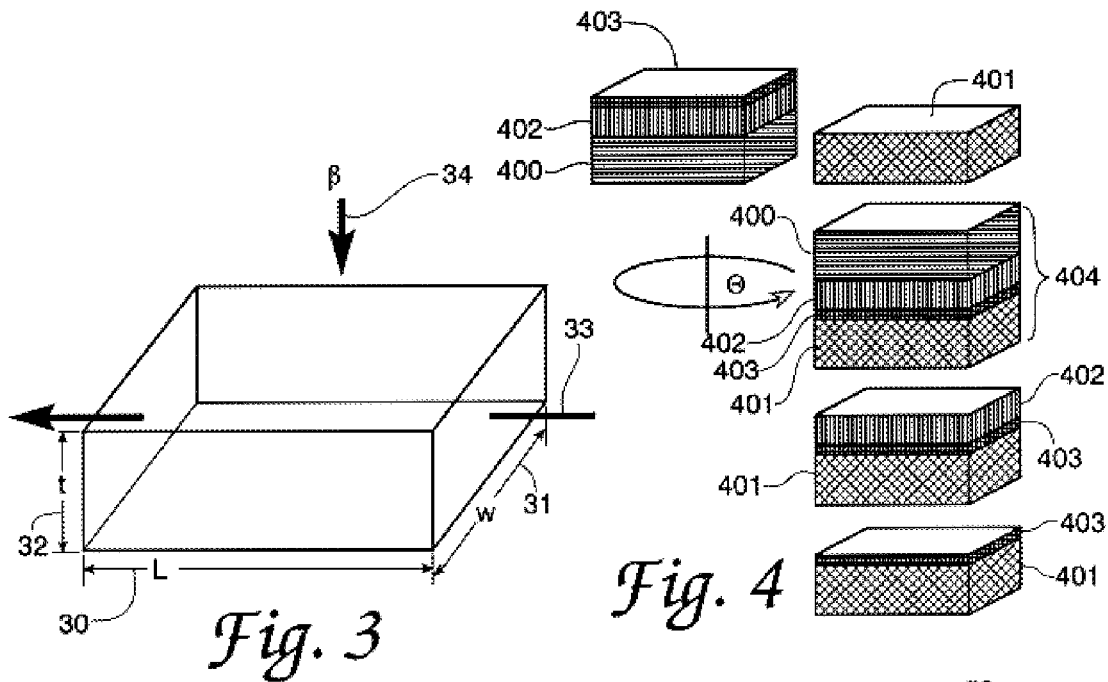
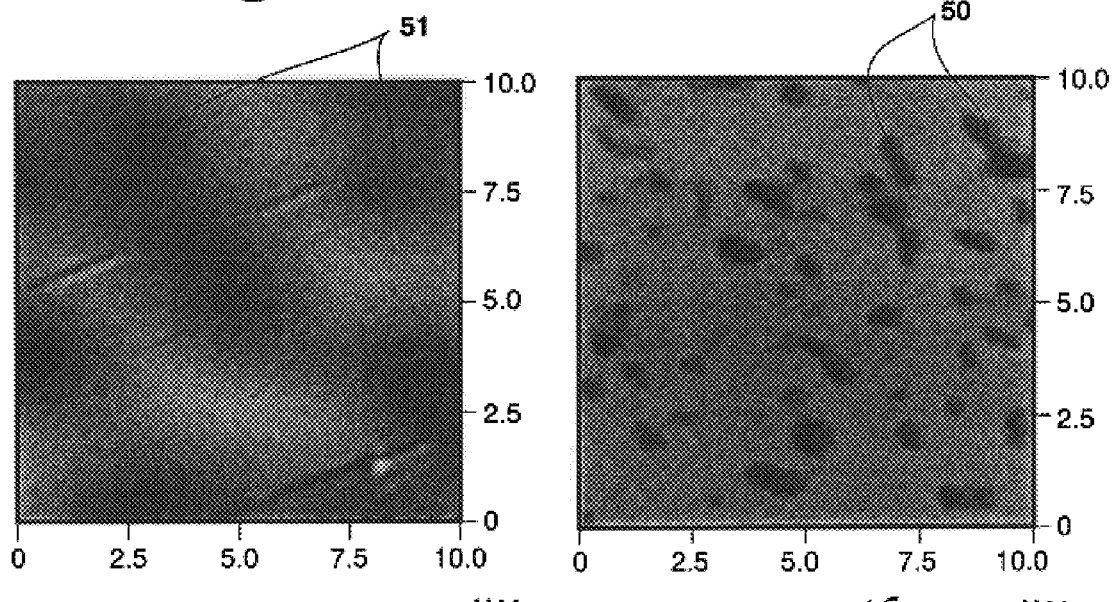

SOLID STATE MAGNETIC FIELD SENSOR METHOD

RIGHTS OF THE GOVERNMENT

The invention described herein may be manufactured and used by or for the Government of the United States for all governmental purposes without the payment of any royalty.

BACKGROUND OF THE INVENTION

Magnetoresistors are devices whose electrical resistance varies with a magnetic field applied to them. They are useful as magnetic field sensors; for example, as moving element detectors in mechanical position sensing applications. FIGS. 1a and 1b of the drawings herein show magnetoresistors at 10 and 11 used in a representative position sensing application. The magnetoresistors 10 and 11 are mounted on top of magnetically conductive support elements such as the ferrous pole members shown at 13 and 14 in the drawings and are used, for example, to sense the passage of ferrous turbine blades 12 and 17 of an aircraft engine. The magnetoresistors sense turbine blade position by responding to a change in local magnetic field strength, which results in a change in the electrical resistance of the intrinsic material of the magnetoresistor.

In FIG. 1a, the quantity of magnetic flux flowing through the magnetoresistor 10, as a result the magnetic flux 15 coupling through the air to the engine rotor, is at a relatively high value with the illustrated close alignment of the blade 12 with the magnetoresistor 10. FIG. 1b shows a decrease in the magnetic flux for the misaligned condition. Other position sensing applications for magnetoresistor magnetic field sensors include automotive engine applications, such as measuring revolution rates and timing events such as fuel injection or fuel ignition, for commutation in brushless electric motors, for naturally occurring magnetic field sensing such as in navigation and terrain responsive guidance systems, in sensors for satellites, and any number of applications where precision motion sensing is required. The noncontact method of magnetic field sensing as accomplished with a magnetoresistor provides longer reliability and longer device service life than is available from contacting arrangements, and in many instances, is more convenient than either voltage generating sensing and optical sensing.

FIG. 2 is a graph showing electrical resistance on the y-axis, 20, as a function of magnetic field intensity, H, on the x-axis, 21, for a typical magnetoresistor element. So long as the magnetoresistor element is located in air surroundings of unity permeability, the magnetic field intensity H and magnetic flux density are equal. As is well known in the electrical art, however, this relationship is often not true in a ferrous magnetic circuit where such effects as saturation of a magnetic member can occur. Curve 22 in FIG. 2 represents the relationship that an increase in electric field intensity produces a related increase in the electrical resistance of the intrinsic material of the magnetoresistor. More specifically, the maximum resistance in the intrinsic material is obtained at a maximum magnetic field intensity and a minimum resistance is obtained at a minimum magnetic field intensity. This relationship is represented mathematically by the following equation:

$$\Delta\rho/\rho = g\mu^2(\Delta\beta)^2 \qquad \text{Eq. 1}$$

where $\Delta\rho$ represents material electrical resistance, g represents a shape factor for the resistor, $\mu$ represents mobility and $\beta$ indicates flux density in the magnetic field. In words, the mathematical relationship provides that a change in intrinsic material resistance is proportional to the square of the change in the magnetic field multiplied by the square of the mobility of the intrinsic material.

A change in magnetoresistor device electrical resistance is also proportional to a change in intrinsic material resistance multiplied by the device length and divided by the product of the device thickness and width as represented by the following mathematical equation:

$$\Delta R = (\Delta\rho L)/(tw) \qquad \text{Eq. 2}$$

where L, t and w are sensor device length, thickness and width, respectively, and $\Delta R$ is change in sensor device electrical resistance. This is further illustrated in FIG. 3 which is a schematic of a magnetoresistive sensor where active layer thickness is shown at 32, active layer length is shown at 30 and magnetic field density is shown at 34.

The sensor signal—the desired output of the magnetoresistive sensor—is the voltage which is proportional to the change in device resistance multiplied by the device current shown at 33 in FIG. 3, represented mathematically by the equation:

$$\Delta V = I \Delta R \qquad \text{Eq. 3}$$

where $\Delta V$ is the change in voltage, I is the current which is presumed constant and $\Delta R$ is the change in device resistance.

Semiconductors have typically been used to create magnetic field sensors such as magnetoresistors. Magnetoresistors are believed to be best formed from high electron mobility semiconductors; that is, by depositing high electron mobility carrier films on a mechanical substrate—an arrangement believed to achieve the highest magnetic sensitivity. Considering Eq. 1, it is apparent that an increase in material electron mobility significantly increases material resistance by a power of two. Considering Eq. 2, it is apparent that a reduction in active layer thickness also produces an increase in device resistance. Therefore, an increase in material electron mobility combined with a reduction in active layer thickness produces a significant increase in device resistance. As shown in Eq. 3, an increase in device resistance allows a reduction in current while still obtaining the same voltage or sensor signal.

In view of these relationships, prior work focused on methods of depositing active films of decreasing thickness onto a sensor substrate. However, due to lack of a suitable substrate—that is, lattice constant and crystal structure matching those of the active film layer—high dislocation densities result and the thin films do not exhibit the desired high material electron mobility which achieves the highest magnetic sensitivity. The density of dislocations is expressed as the dislocation line unit per unit volume, $cm/cm^3$ or $cm^{-2}$. The dislocation line units are imperfections in the crystalline lattice spacing and commonly result to accommodate strain induced due to lattice mismatched materials. The thinning process in the method of the prior art induces defects in the device which reduce the electron mobility of the active layer below desirable limits. Accordingly, to avoid such defects, common magnetoresistors are made in the order of microns in thickness. A conventional magnetoresistor has an electron mobility in excess of 25,000 centimeters squared per volt second and a thickness of a few microns (typically 1–3). At these dimensions, the resistance of a typical device is only a few ohms. As a result, a device layout with hundreds of individual resistors connected in series allows for a total device resistance in the kilohm range. At this total device resistance, a current in the milliampere range is still needed in order to create a sufficient voltage change for measurement purposes. This amount of current causes detrimental device heating effects and limits the ability to operate these sensors using batteries.

The invention provides a method for making magnetoresistors that have a dislocation density reduced by at least five orders of magnitude. Magnetoresistors produced by the method of the invention have improved performance because an ultrathin active film is deposited on a compliant substrate. Depositing an ultrathin active film layer on a compliant substrate results in a higher device resistance with lower current requirements for device operation. A reduced sensor current for operation of magnetoresistors reduces problems due to device heating and allows for battery operation of such devices.

SUMMARY OF THE INVENTION

A method for making a magnetoresistive sensing device including depositing an active film responsive to changes in magnetic field energy onto a compliant layer on a semiconductor substrate wafer, the compliant layer being capable of retaining strain energy resulting from the deposition of semiconductor materials with different lattice constants. This method produces a battery operable ultrathin device highly sensitive to changes in magnetic field flux.

It is an object of the invention to provide a method for making a high sensitivity magnetic field sensing device.

It is another object of the invention to provide a method for making a high sensitivity magnetic field sensing device including a compliant layer on a semiconductor substrate wafer.

It is another object of the invention to provide a method for making an ultrathin, high sensitivity magnetic field sensing device.

It is another object of the invention to provide a method for making a high sensitivity magnetic field sensing device operable on batteries.

It is another object of the invention to provide a method for making a high sensitivity magnetic field sensing device capable of long-term operation at high temperatures.

It is another object of the invention to provide a method for making a high sensitivity, high reliability magnetic field sensing device.

It is another object of the invention to provide a method for making magnetic field sensing device having long service life.

These and other objects of the invention are described in the description, claims and accompanying drawings and are achieved by a method of fabricating a magnetoresistive device of thin film improved low bias current and high electron mobility, said method comprising the steps of:

providing a wafer of periodic table group III–V semiconductor substrate material;

forming on said semiconductor substrate material a periodic table group III–V material semiconductor layer capable of strain energy retention responsive to deposition of overlaying active films of substantially compatible crystal structure semiconductor material;

depositing strain-free, active film of magnetic flux responsive periodic table group III–V semiconductor material, of differing crystal lattice molecular bond length than said compliant periodic table group III–V semiconductor layer, onto said compliant periodic table group III–V material semiconductor layer; and attaching bias current and signal conveying electrodes onto said active film.

BRIEF DESCRIPTION OF THE DRAWINGS

FIG. 3 shows a schematic representation of a magnetoresistive sensor.

FIG. 4 shows a schematic illustrating the process of forming a compliant substrate.

FIG. 5a is a top view of an atomic force microscopy image of an active film in accordance with the invention.

FIG. 5b is a top view of an atomic force microscopy image of an active film in the absence of a compliant layer.

DETAILED DESCRIPTION

Figure 7:
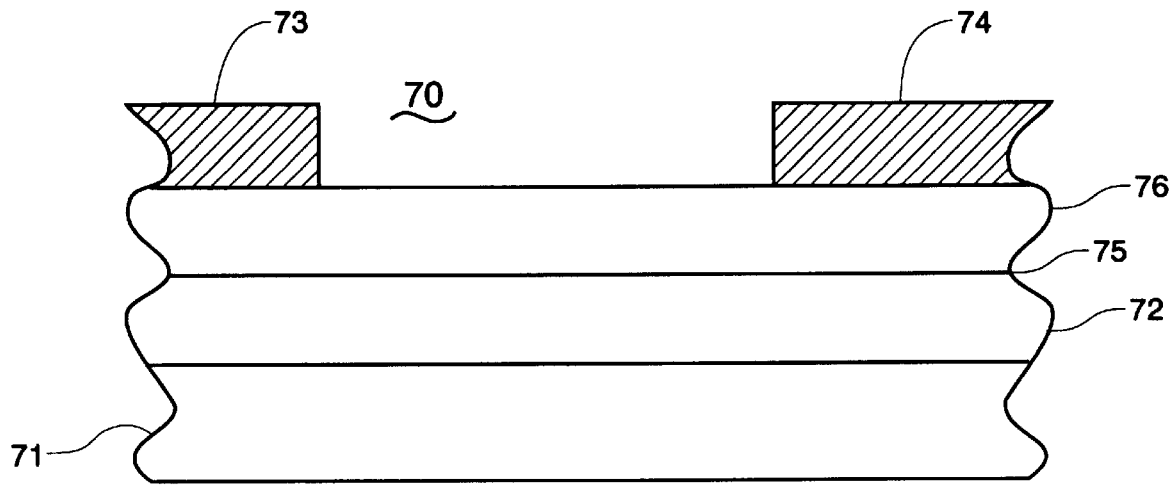
FIG. 7 is a cross-sectional view of a magnetoresistor in accordance with the invention.

The invention provides a method for making a magnetic field sensing device including the steps of forming onto a semiconductor substrate wafer a strain retaining compliant layer followed by an ultrathin high electron mobility active layer of a differing lattice constant or crystalline structure than the compliant layer. Referring now to FIG. 7 there is a cross-sectional view of a magnetoresistor 70 made in accordance with the invention. Generally, magnetoresistor 70 comprises a mechanical substrate wafer of semiconductor substrate material 71 with a compliant layer of periodic table group III–V material 72 deposited or grown on the surface of the substrate. On the compliant layer 72 the ultrathin high electron mobility active film 76 of semiconductor periodic table group III–V material is deposited or grown. At the surface of the active film are terminal contacts 73 and 74 that conduct bias current and signal voltage. Separate contacts for current and voltage may also be used. The invention provides improved magnetic field sensing and at the same time requires less bias current for operation.

As is known in the art, a semiconductor substrate wafer generally has a lattice constant differing from that of an active film which is deposited or grown thereon, i.e., the two materials are often lattice mismatched. "Lattice constant" refers to the size of the unit cell for a crystalline material. In magnetoresistors known in the art, generally comprising a semiconductor substrate wafer and a relatively thick active film, the strain energy resulting from lattice mismatch is released in the active film layer itself. That is, during growth or deposition, the active layer undesirably releases its strain energy in the form of dislocations formed in its own structure. As a result of such dislocations in the active film, the electron mobility of the film is decreased. Therefore, in known devices to achieve the desired degree of electron mobility in the active film, the active film is generally made relatively thick, in the order of a few microns (1–3). For example, even at a thickness of 1.5 microns the electron mobility is generally no greater than 25,000 centimeters squared per volt second which is approximately one-third that possible due to dislocations in the active film.

In the arrangement of the invention, however, a compliant layer, shown at 72 in FIG. 7, is used in fabricating the magnetoresistor. A layer selected from periodic table group III–V material, material that has a compatible crystal structure with the selected active film 76, is used as a mechanism for retaining the released strain energy as a result of the lattice mismatch between layer 76 and layer 71, i.e., the lattice mismatch created during epitaxial film deposition. Releasing strain energy in layer 72 leaves the active film of layer 76 strain-free and free of dislocation.

One possible method of creating a compliant substrate is shown in FIG. 4. A standard commercially available gallium arsenide substrate 400 is bonded to a specifically prepared substrate 401. The specifically prepared substrate 401 can be created by epitaxially depositing a sacrificial layer 402 such as aluminum arsenide followed by a thin gallium arsenide layer 403. The two substrates are rotated and bonded as shown at 404. The heating and pressure used during the process of twist bonding allows the thin gallium arsenide layer to later become a compliant layer. The substrate 400 is then removed by a combination of chemical and mechanical polishing. The basic value of a compliant substrate, that is the combination of a semiconductor substrate wafer and a compliant layer, can be appreciated by considering that at the interface between a compliant layer and the substrate, there exists a two-dimensional array of screw dislocations. Due to the screw dislocations, the atoms in the compliant layer are substantially misaligned from the atoms in the bulk substrate 71 in FIG. 7. This misalignment causes the atoms in the compliant layer to easily adjust their positions in order to comply to the lattice of an active film grown on its surface.

Figure 1A:
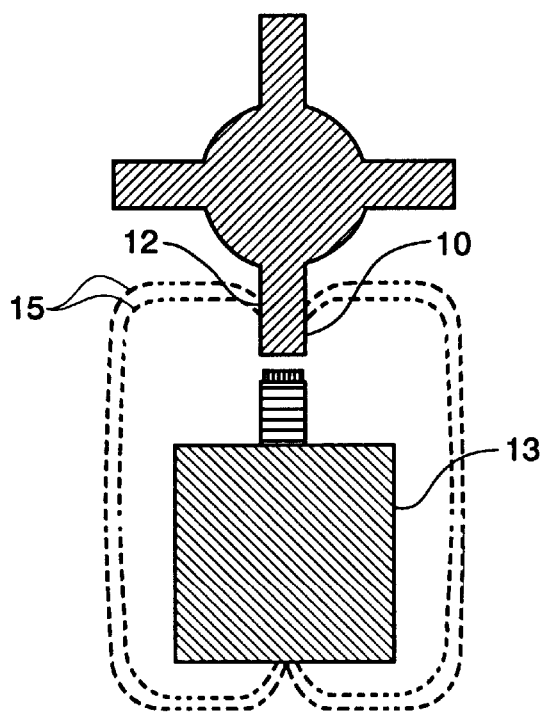
FIG. 1a shows a magnetic field around a magnetoresistive sensor in the presence of an aligned turbine blade.
Figure 1B:
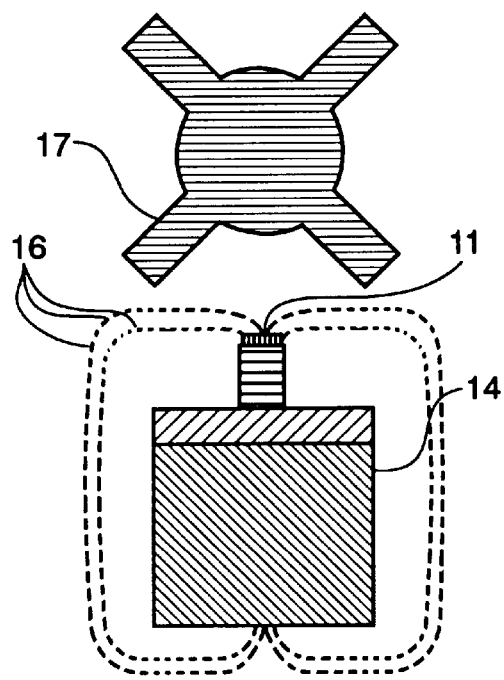
FIG. 1b shows a magnetic field around a magnetoresistive sensor in the absence of an aligned turbine blade.
Figure 2:
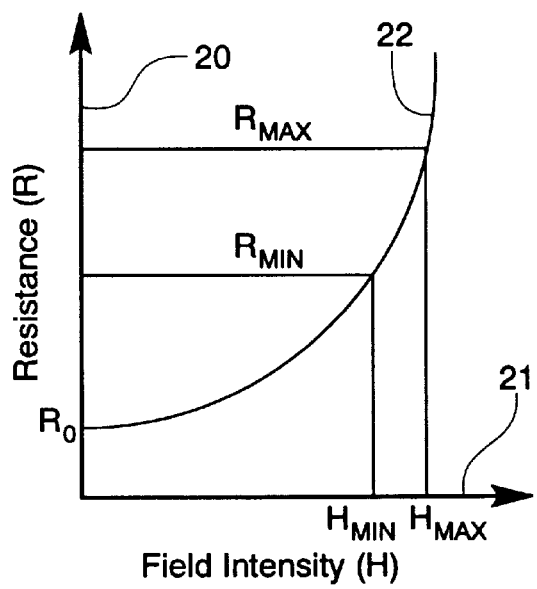
FIG. 2 shows the relationship between resistance and magnetic field intensity in a magnetoresistive device.
Figure 6:
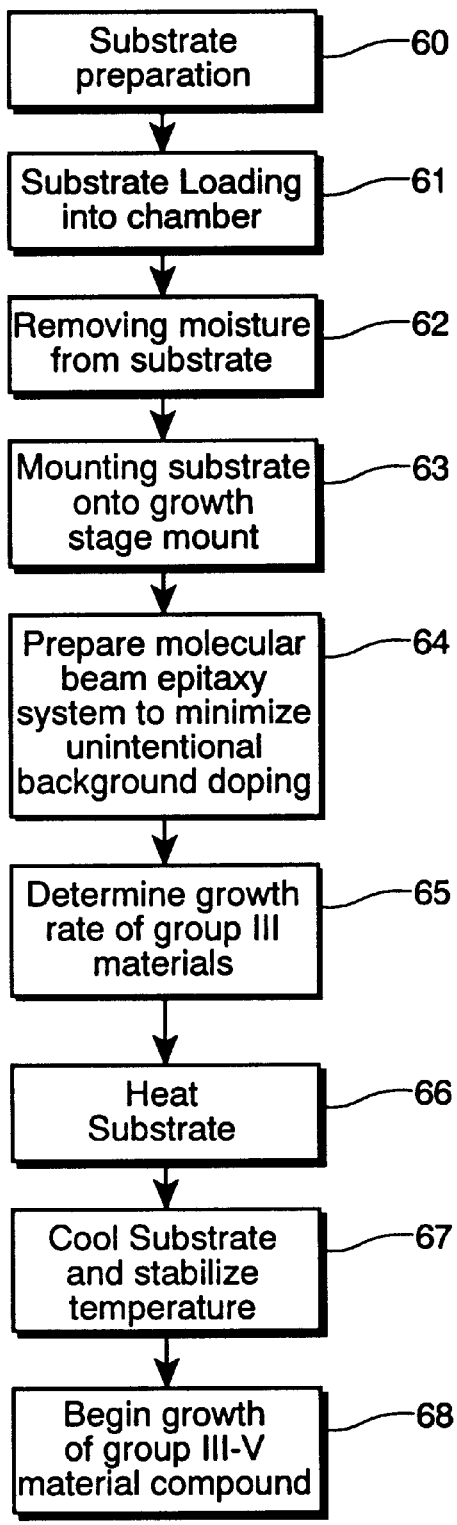
FIG. 6 is a flow diagram showing the process of fabricating a magnetoresistive sensor in accordance with the invention.

A method for making the magnetoresistive sensing device of the invention includes using an epitaxial film deposition technique to deposit the active film onto a previously formed compliant substrate. A flow chart describing the steps for fabricating such a device is shown in FIG. 6. The compliant substrate is first prepared for epitaxial growth of the active film. The characteristics of the compliant layer, which make it capable of retaining all the stress energy associated with epitaxial growth of the active film, also make the compliant layer relatively sensitive. Special loading and preparation steps, shown in steps 60–63 of FIG. 6, must be followed to avoid damaging the compliant layer in fabricating the device.

Figure 8:
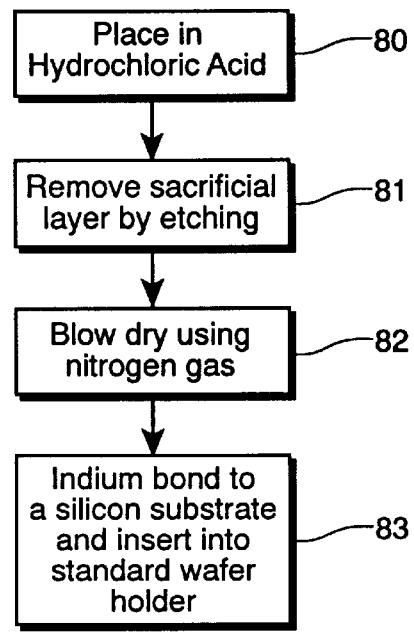
FIG. 8 is a flow diagram showing the process of preparing a compliant substrate.

The sacrificial layer used in making the compliant substrate is first removed from the compliant substrate. A flow chart describing the steps of this preparation is shown in FIG. 8. The compliant substrate is placed in concentrated hydrochloric acid at room temperature to remove the sacrificial layer of aluminum gallium arsenide as described in block 80. A preferential etchant such as hydrochloric acid is used to remove the sacrificial layer while not etching the thin compliant layer. The container with the hydrochloric acid and substrate are placed on a receptacle within the chamber of an ultrasonic vibrator to enhance etching. The sacrificial layer is removed by etching while in the acid bath as described in block 81. After the etch is complete, the wafer is removed from the acid bath and blown dry using nitrogen gas as described in block 82. The now-dry compliant substrate is then ready for epitaxial film deposition. The wafer is indium bonded to a silicon substrate and inserted into a standard three-inch wafer substrate holder as described in block 83. The wafer is then loaded into the entry load lock of a molecular beam epitaxy reactor as described in block 61 of FIG. 6. The load lock chamber is then evacuated to a pressure of less than $10^{-7}$ torr. After 30 minutes or more, the wafer and substrate holder are outgassed at a temperature of 200° C. for twenty minutes. The outgassing removes moisture from the surface of the compliant layer as described in block 62. The wafer is then allowed to cool for approximately 30 minutes to ambient temperature and loaded onto the growth stage substrate mount as described in block 63.

The molecular beam epitaxy system is prepared to minimize unintentional background doping using standard industry methods as represented in block 64 of FIG. 6. This includes "baking" the system, where the entire molecular beam epitaxy reactor is heated to result in a better vacuum. The cells are "dumped" prior to actual growth to reduce source contamination and stabilize the effusion cell fluxes. "Dumping" includes setting the effusion cell temperatures of each of the cells to approximately 25° C. greater than the expected operating temperature and emitting a flux for a few hours. Molecular beam epitaxy is the film deposition technique used in describing the magnetoresistor device method of FIG. 6. However, any known epitaxial film deposition techniques such as metal oxide chemical vapor deposition, pulsed laser deposition and vapor phase epitaxy, for example, may be used in depositing the active film onto the compliant wafer.

The settings for the growth rate of the active film as described in block 65 of FIG. 6 are as follows. The growth rate of the group III materials (gallium and indium) are determined using Reflection High Energy Electron Diffraction oscillations and verified using both High Resolution X-Ray Diffraction and Transmission Electron Microscopy measurements. The antimony source is adjusted to generate at least ten times as many antimony atoms as gallium or indium atoms per second according to the beam flux gauge. Such flux ratio is denoted as a V/III flux ratio of greater than 10. The cracker temperature of the antimony effusion cell is set to produce a majority of the flux as antimony monomers, instead of antimony dimers or tetramers. The compliant substrate temperature is increased to facilitate growth. While the compliant substrate is increasing in temperature, the antimony source is opened for an antimony overpressure generation. However, the compliant substrate is not exposed to antimony until it is at approximately 300° C. The compliant substrate is heated, as set forth in block 66, until the optical pyrometer indicates a temperature of 575° C. At a temperature of 575° C., the oxide layer present on the gallium arsenide substrate is desorbed and confirmed by Reflection High Energy Electron Diffraction. The compliant substrate is then cooled to a temperature of 400° C.

The temperature is stabilized at 400° C., as described in block 67 of FIG. 6, and then growth of the periodic table group III–V semiconductor material, either gallium antimony or indium antimony, is started as represented in block 68 of FIG. 6. Growth continues for a preselected time to achieve a desired thickness based on a known growth rate. For the magnetoresistor of the invention, the growth thickness desired will be between a few hundred angstroms and a few thousand angstroms. A thicker/thinner active film may be desired depending on the desired power, operating temperature, and surface area of the final device. After the desired thickness of the periodic table group III–V semiconductor material is grown, the growth is stopped by closing the shutter of the group III compound. At the same time, the substrate temperature is reduced to room temperature and the antimony overpressure is reduced. The molecular beam epitaxy grown films are then removed from the vacuum chamber and characterized.

The method of the invention illustrated in FIG. 6 results in a reduction in dislocation density realizable by employing a compliant substrate. This allows for a much thinner active film in the magnetic film sensing device while maintaining the desired high electron mobility. As set forth in Eq. 2, the resistance of the device is inversely proportional to the active layer thickness. Therefore, by reducing active layer thickness, shown at 32 in FIG. 3, the increased device resistance allows for a reduction in current, represented at 33 in FIG. 3. The lower current requirements enable the use of battery operated sensors. Battery operation of magnetoresistor sensing devices has heretofore been difficult and is significant from a practical point of view because such sensors can now be included in portable electronics. Additionally, use of lower currents reduces detrimental effects due to heating and the device is more reliable and has a longer service life.

The quality of the active film obtainable in a magnetoresistive sensor using a compliant substrate relative to the quality of an active film obtained on a non-compliant conventional substrate is illustrated in FIGS. 5a and 5b. FIG. 5a is an atomic force microscopy image of a molecular beam epitaxy deposited InSb layer on a compliant substrate and FIG. 5b is an atomic force microscopy image of a molecular beam epitaxy deposited InSb layer on a conventional substrate. Both FIGS. 5a and 5b images are scaled in micrometers ($\mu$m). FIG. 5a shows a rolling surface and there is no indication that the InSb layer contains dislocations. The diagonal features in this drawing represent dislocations. In contrast, the InSb growth on the conventional non-compliant substrate illustrated in FIG. 5b shows at the typical locations 50 that the strain of the substrate did register in the film, resulting in a highly dislocated film.

A magnetoresistive sensor comprised of a compliant substrate contains nearly all the dislocations within the compliant layer, leaving an ultrathin active layer which is free from dislocations and therefore has high electron mobility and in turn very high sensitivity to changes in magnetic field energy. These properties generate a more accurate, large device resistance or output signal at low current. The low current requirement is attractive for several reasons. It reduces problems in device operation due to heating. It allows the device to be battery operated and easily integrated into microelectronics with applications ranging from automotive to telecommunications to aerospace. Further, the low current requirement increases device reliability and its useful service life. Even greater service life can be obtained in a magnetoresistive sensing device by housing it in a heat resistant material such as a ceramic. Such a ceramic material would not interfere with the sensed magnetic field and associated resistance and signal transmission.

While the apparatus and method herein described constitute a preferred embodiment of the invention, it is to be understood that the invention is not limited to this precise form of apparatus or method. Changes may be made therein without departing from the scope of the invention, which is defined in the appended claims.

We claim:

1. The method of fabricating a magnetoresistive device of thin film improved low bias current and high electron mobility, said method comprising the steps of:

providing a wafer of periodic table group III–V semiconductor substrate material;

forming on said semiconductor substrate material a periodic table group III–V material semiconductor layer capable of strain energy retention in response to deposition of overlaying active films of substantially compatible crystal structure semiconductor material;

depositing a strain-free, active film of magnetic flux responsive periodic table group III–V semiconductor material, of differing crystal lattice molecular bond length than said compliant periodic table group III–V semiconductor layer, onto said compliant periodic table group III–V material semiconductor layer; and attaching bias current and signal conveying electrodes onto said active film.

2. The method of claim 1 wherein said semiconductor substrate material comprises a wafer of gallium arsenide substrate material.

3. The method of claim 1 wherein said semiconductor substrate material comprises a layer of crystalline indium antimonide material.

4. The method of claim 1 wherein said step of forming on said semiconductor substrate material a compliant periodic table group III–V material semiconductor layer further includes forming on said semiconductor substrate material a compliant periodic table group III–V material semiconductor layer of less than 500 angstroms thickness.

5. The method of claim 1 wherein said depositing step further comprises one of epitaxial film deposition techniques from group comprising molecular beam epitaxy, pulsed laser deposition and metal oxide chemical vapor deposition.

6. The method of claim 1 wherein said depositing step further includes growing a semiconductor active film of less than 1 micron thickness dimension.

7. The method of claim 1 further including after said step of attaching bias current and signal conveying electrodes on said active film an additional step of housing said magnetoresistive sensing device in a heat resistant ceramic enclosure.

8. The method of claim 1 wherein said depositing step further includes growing a semiconductor active film of n-type indium antimonide material.

9. The method of claim 1 wherein said depositing step further includes growing a semiconductor active film of indium antimonide material 2000 angstroms thickness.

10. The method of claim 1 wherein said forming step further includes forming on said semiconductor substrate wafer a compliant gallium arsenide layer.

11. A method of fabricating a magnetoresistive device of thin film improved low bias current and high electron mobility, said method comprising the steps of:

providing a first semiconductor substrate wafer of gallium arsenide semiconductor material;

depositing a selective etching sacrificial layer aluminum arsenide onto said substrate;

forming on said aluminum arsenide layer a compliant gallium arsenide semiconductor material layer capable of strain energy retention responsive to deposition of overlaying active films of substantially compatible crystal structure;

bonding a second semiconductor substrate wafer of gallium arsenide material to said compliant layer to form a multiple layered assembly;

chemically removing said first semiconductor substrate wafer and said layer of aluminum arsenide from said first semiconductor substrate wafer, said second semiconductor substrate wafer having a remaining compliant layer of 30–100 angstroms denoted as the compliant substrate;

removing moisture from said multiple layered assembly and said compliant layer by elevated temperature outgassing;

cooling said multiple layered assembly to ambient temperature;

depositing by molecular beam epitaxy a strain-free, semiconductor active film of magnetic flux responsive indium antimonide semiconductor material of a preselected thickness and differing crystal lattice molecular bond length than said compliant layer, onto said compliant gallium arsenide semiconductor material layer;

electrically characterizing said film of magnetic flux responsive indium antimonide semiconductor material; and attaching bias current and signal conveying electrodes on said active film.

12. The method of claim 11 wherein said removing step further includes removing moisture by outgassing at a temperature of 200° C. for twenty minutes.

13. The method of claim 11 wherein said depositing step further includes determining a film growth rate using reflection high energy electron diffraction.

14. The method of claim 11 wherein said depositing step further includes selecting an antimony effusion cell temperature to generate an antimony monomer majority flux.

15. The method of claim 11 wherein said depositing step further includes heating said multiple layered assembly to a temperature of 575° C.

16. The method of claim 11 wherein said depositing step further includes cooling said multiple layered assembly to a temperature of 400° C.

17. The method of claim 11 wherein said depositing step further includes depositing an active film having a thickness of 2000 angstroms.

* * * * *